(12) United States Patent
Moriya et al.

(10) Patent No.: US 10,529,846 B2
(45) Date of Patent: Jan. 7, 2020

(54) SEMICONDUCTOR DEVICE AND METHOD OF MANUFACTURING THE SAME

(71) Applicant: Renesas Electronics Corporation, Tokyo (JP)

(72) Inventors: Taro Moriya, Hitachinaka (JP); Hiroyoshi Kudou, Hitachinaka (JP); Hiroshi Yanagigawa, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/028,146

(22) Filed: Jul. 5, 2018

(65) Prior Publication Data

US 2019/0043983 A1 Feb. 7, 2019

(30) Foreign Application Priority Data

Aug. 7, 2017 (JP) ................................ 2017-152602

(51) Int. Cl.
*H01L 29/78* (2006.01)
*H01L 29/06* (2006.01)
*H01L 29/10* (2006.01)
*H01L 23/00* (2006.01)
*H01L 29/423* (2006.01)
(Continued)

(52) U.S. Cl.
CPC ........ *H01L 29/7813* (2013.01); *H01L 21/763* (2013.01); *H01L 24/03* (2013.01); *H01L 27/0629* (2013.01); *H01L 29/0634* (2013.01); *H01L 29/1095* (2013.01); *H01L 29/4236* (2013.01); *H01L 29/4238* (2013.01); *H01L 29/7811* (2013.01)

(58) Field of Classification Search
CPC ............. H01L 29/7395; H01L 29/7788; H01L 29/7813; H01L 29/7827; H01L 29/78642
See application file for complete search history.

(56) References Cited

U.S. PATENT DOCUMENTS 7,335,949 B2 2/2008 Ninomiya et al.
8,530,966 B2 9/2013 Narazaki et al.
(Continued)

FOREIGN PATENT DOCUMENTS

JP 2006-196518 A 7/2006
JP 2012-129446 A 7/2012
JP 2013-033931 A 1/2013

*Primary Examiner* — Jae Lee
(74) *Attorney, Agent, or Firm* — McGinn IP Law Group, PLLC

(57) ABSTRACT

A semiconductor device includes a semiconductor substrate, a gate electrode, and a first contact plug. The semiconductor substrate includes a first surface and a second surface. Over the semiconductor substrate, a source region, a drain region, a drift region, and a body region are formed. A first trench in which the gate electrode is buried is formed in the first surface. The first surface includes an effective region and a peripheral region. The first trench extends from the peripheral region over the effective region along a first direction. The gate electrode includes a portion opposed to and insulated from the body region sandwiched between the source region and the drift region. In the peripheral region, the first contact plug is electrically coupled to the gate electrode buried in the first trench such that its longer side is along the first direction when seen in a plan view.

8 Claims, 12 Drawing Sheets

(51) Int. Cl.
*H01L 21/763* (2006.01)
*H01L 27/06* (2006.01)

(56) References Cited

U.S. PATENT DOCUMENTS 8,772,827 B2 7/2014 Yoshimochi
2015/0295079 A1* 10/2015 Nakano ................ H01L 29/401
257/330

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2017-152602 filed on Aug. 7, 2017 including the specification, drawings and abstract is incorporated herein by reference in its entirety.

BACKGROUND

The present invention relates to a semiconductor device and a method of manufacturing the same.

There has been known a semiconductor device disclosed in Patent Document 1 (Japanese Unexamined Patent Application Publication No. 2006-196518). The semiconductor device disclosed in Patent Document 1 is a trench-gate type power MOSFET (Metal Oxide Semiconductor Field Effect Transistor) which has a super-junction configuration. According to the semiconductor device disclosed in Patent Document 1, a trench is formed in a surface of a semiconductor substrate in a peripheral region. In the trench, a gate electrode is buried.

As other configurations of the trench-gate type power MOSFET, a configuration disclosed in Patent Document 2 (Japanese Unexamined Patent Application Publication No. 2013-33931) and a configuration disclosed in Patent Document (Japanese Unexamined Patent Application Publication No. 2012-129446) are known.

PATENT DOCUMENTS

[Patent Document 1] Japanese Unexamined Patent Application Publication No. 2006-196518
[Patent Document 2] Japanese Unexamined Patent Application Publication No. 2013-33931
[Patent Document 3] Japanese Unexamined Patent Application Publication No. 2012-129446

SUMMARY

According to the semiconductor device disclosed in Patent Document 1, column regions are arranged in a staggered manner when seen in a plan view. Therefore, it is necessary that the trench in which the gate electrode is buried in the peripheral region should be formed avoiding the column regions. Thus, when there is a place where a trench cannot be provided in the semiconductor substrate, the trench has to be formed avoiding the place concerned.

In such a case, the trench in which the gate electrode is buried in the peripheral region cannot be formed to be long linearly in a direction parallel with the peripheral region. That is, the above inevitably reduces a longer-side dimension of the contact plug electrically coupled to the gate electrode to be buried in the trench formed in the peripheral region. According to the knowledge acquired by the present inventers, when the longer-side dimension of the contact plug becomes small, contact resistance there comparatively increases more than a decrease in area due to the reduction in dimension.

Other objects and novel features of the present invention will become apparent from the description of the present specification and the accompanying drawings.

A semiconductor device according to one embodiment includes a semiconductor substrate, a gate electrode, and a first contact plug. The semiconductor substrate includes a first surface and a second surface opposite to the first surface. Also, there are formed, over the semiconductor substrate, a source region of a first conductivity type arranged in the first surface, a drain region of a first conductivity type arranged in the second surface, a drift region of the first conductivity type arranged in the drain region of the first surface side, and a body region of a second conductivity type opposite to the first conductivity type sandwiched between the source region and the drift region. In the first surface, there is provided a first trench which extends toward the second surface as to reach the drift region and in which a gate electrode is buried. The first surface includes an effective region in which the source region is arranged and a peripheral region which surrounds the effective region. The first trench extends from the peripheral region over the effective region, when seen in a plan view, along a first direction from the peripheral region toward the effective region. The gate electrode includes a portion opposed to and insulated from the body region sandwiched between the source region and the drift region. In the peripheral region, the first contact plug is electrically coupled to the gate electrode buried in the first trench such that its longer side is along the first direction when seen in a plan view.

In accordance with the semiconductor device of one embodiment, even when the trench in which the gate electrode is buried cannot be formed long linearly in the peripheral region, increase in the contact resistance can be suppressed.

DETAILED DESCRIPTION

Figure 1:
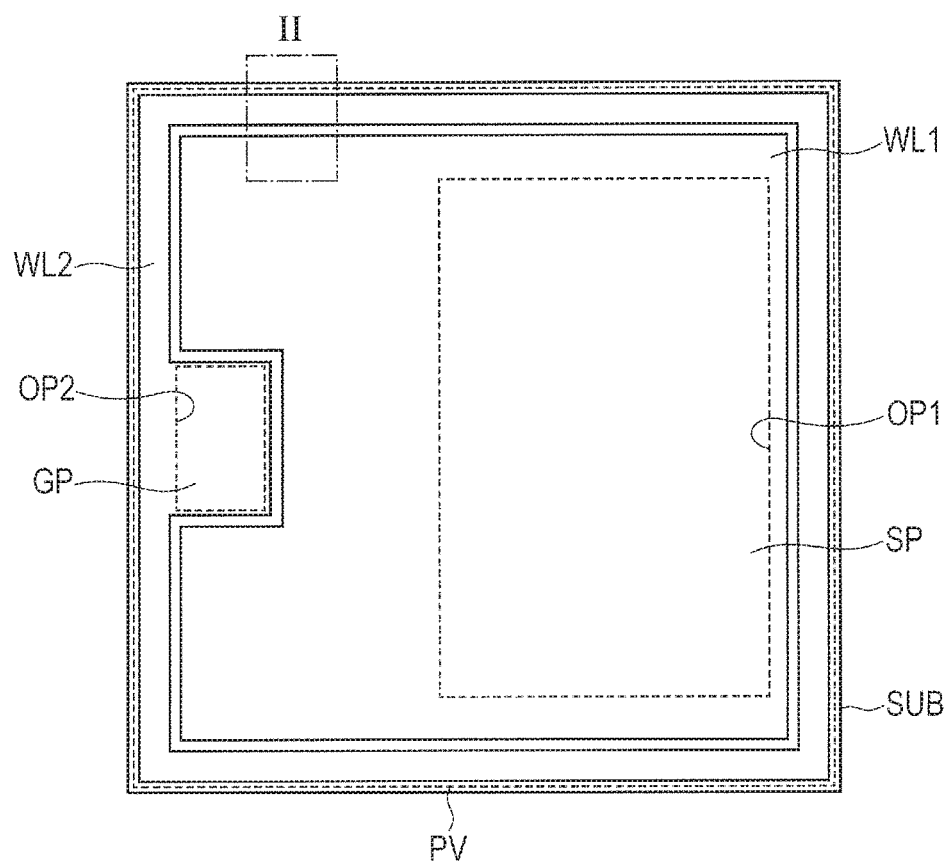
FIG. 1 is a top view of a semiconductor device according to Embodiment 1.
Figure 2:
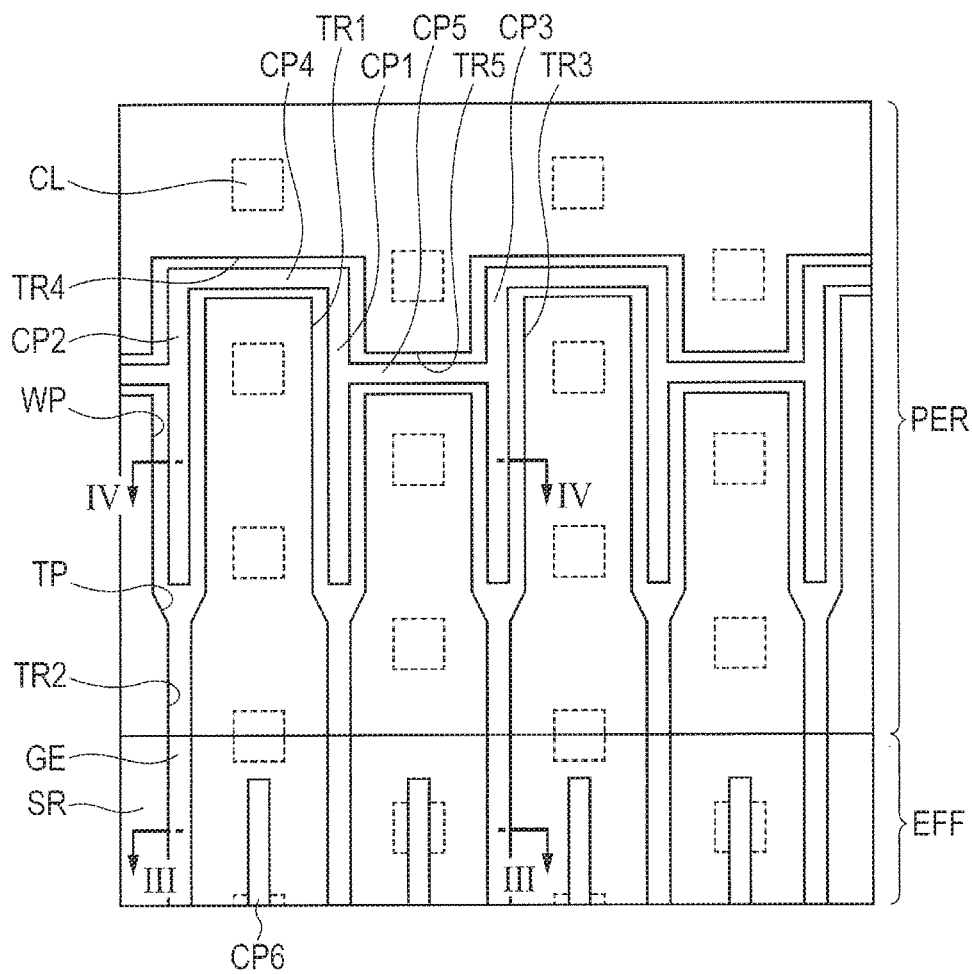
FIG. 2 is an enlarged view in a region II of FIG. 1.
Figure 3:
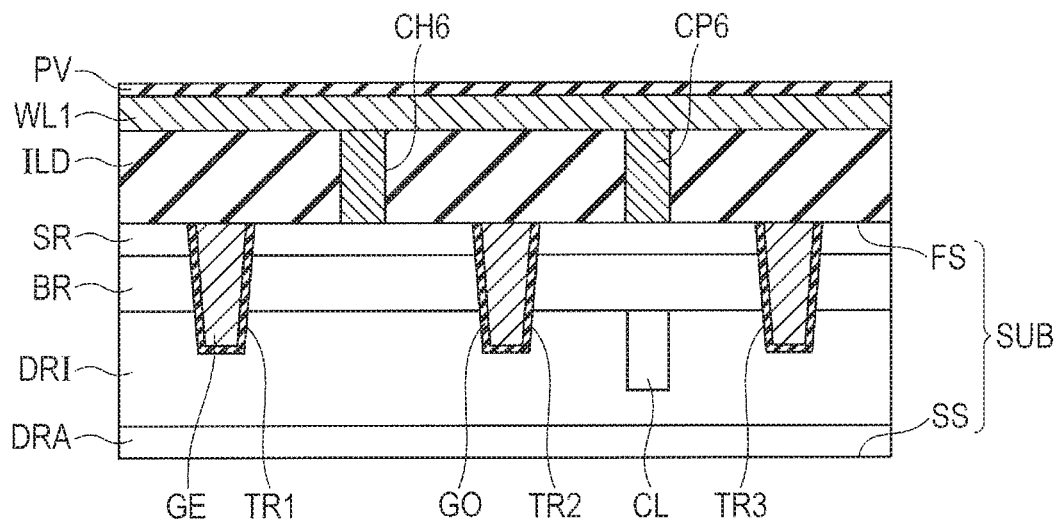
FIG. 3 is a sectional view taken along line III-III of FIG. 2.
Figure 4:
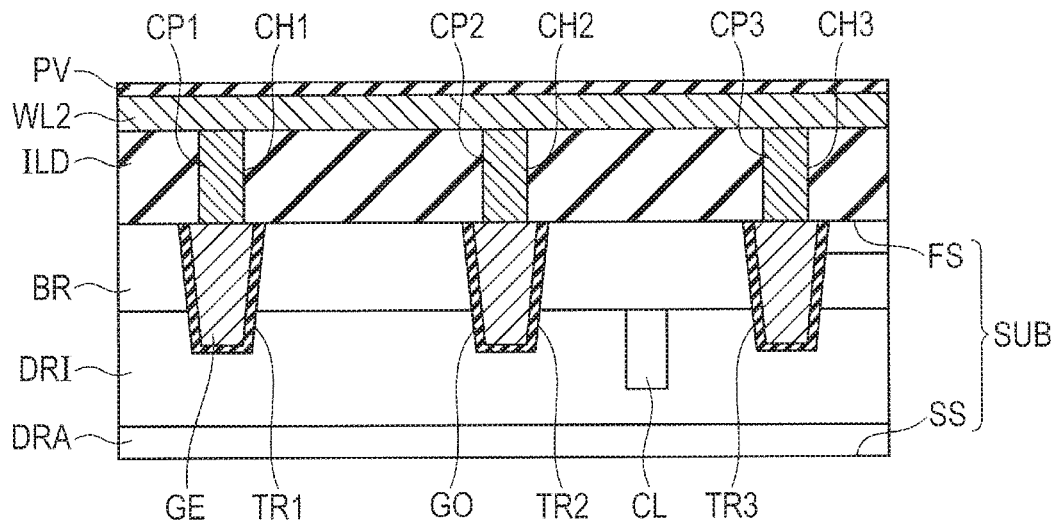
FIG. 4 is a sectional view taken along line IV-IV of FIG. 2.

With reference to the drawings, detailed embodiments will now be explained. In the drawings below, the same elements are denoted by the same reference numerals, and a repeated explanation is omitted.

Embodiment 1

Now, a configuration of a semiconductor device according to Embodiment 1 will be explained.

As shown in FIGS. 1 to 4, the semiconductor device according to Embodiment 1 includes a semiconductor substrate SUB, a gate insulating film GO, and a gate electrode GE. The semiconductor device according to Embodiment 1 further includes an interlayer insulating film ILD, a wiring WL1, a wiring WL2, and a passivation film PV. The semiconductor device according to Embodiment 1 further includes contact plugs CP1 to CP6.

The semiconductor substrate SUB includes a first surface FS and a second surface SS. The second surface SS is a surface opposite to the first surface FS. The semiconductor substrate SUB is formed of mono-crystalline silicon (Si), for example.

The first surface FS includes an effective region EFF and a peripheral region PER. In this regard, the effective region EFF is a region where a source region SR is provided in the first surface FS and the peripheral region PER is a region which surrounds the effective region EFF when seen in a plan view.

The semiconductor substrate SUB includes the source region SR, a drain region DRA, a drift region DRI, and a body region BR. The semiconductor substrate SUB may include a column region CL.

The source region SR is arranged in the first surface FS. The source region SR is of a first conductivity type. The drain region DRA is arranged in the second surface SS. The drain region DRA is of the first conductive type. The drift region DRI is arranged over the drain region DRA. That is, the drift region DRI is arranged in the drain region DRA on the first surface FS side. Preferably, a concentration ratio of impurities in the drift region DRI is lower than a concentration ratio of impurities in the source region SR and the drain region DRA.

The body region BR is so arranged as to be sandwiched between the source region SR and the drift region DRI. The body region BR is of a second conductivity type. The second conductivity type is a type opposite to the first conductivity type. For example, when the first conductivity type is an n type, the second conductivity type is a p type.

The column region CL extends from the body region toward the second surface SS so as to reach the drift region DRI. The column region CL is of the second conductivity type. There are provided a plurality of column regions CL. From the aspect of securing breakdown voltage in the peripheral region PER, it is preferable that the column regions CL are provided not only in the effective region EFF but also in the peripheral region PER.

The column regions CL are arranged in lines along a direction (hereafter, referred to as a "first direction") which extends to the effective region EFF from the peripheral region PER. The lines of the column regions CL are arranged adjacent to each other in a direction (hereafter, referred to as a "second direction") being perpendicular to the first direction. The lines of the column region CL adjacent to each other are arranged in a shifted manner in the first direction. That is, when seen in a plan view, the column regions CL are arranged in a staggered manner. It is preferable that each interval between the adjacent column regions CL be equal.

Also, when the column regions CL are arranged in a staggered manner when seen in a plan view, as compared with the case where the column regions CL are arranged in the shape of a rectangular grid in a plan view, intervals of disposition of the column regions CL can be made uniform. As a result, because of the column regions CL being provided, the drift region DRI can be depleted more uniformly.

Trenches TR1 to TR5 are provided in the first surface FS. The trenches TR1 to TR5 extend toward the second surface SS. The trenches TR1 to TR5 extend so as to reach the drift region DRI. In the effective region EFF, the source region SR, the body region BR, and the drift region DRI are exposed from sidewalls of the trenches TR1, TR2, and TR3.

The trenches TR1 to TR3 extend along the first direction from the peripheral region PER over the effective region EFF. The trenches TR4 and TR5 extend along the second direction in the peripheral region PER.

In the second direction, the trenches TR2 and TR3 are arranged adjacent to the trench TR1 while being spaced from the trench TR1. The trench TR4 couples the trench TR1 with the trench TR2. More specifically, the trench TR4 couples an edge of the trench TR1 on the peripheral region PER side with an edge of the trench TR2 on the peripheral region PER side. The trench TR5 couples the trench TR1 with the trench TR3. In the first direction, the trench TR5 is located closer to the effective region EFF side than the trench TR4.

When seen in a plan view, the trenches TR1 to TR5 are so arranged as not to overlap with the column regions CL. To put it differently, when seen in a plan view, the trenches TR1 to TR5 are so arranged as to pass through the column regions CL.

The trenches TR1, TR2, and TR3 may include extended width portions WP. The extended width portions WP are located in the peripheral region PER. Widths of the trenches TR1, TR2, and TR3 of the extended width portions WP in the second direction are greater than widths of the trenches TR1, Tr2, and TR3 in the effective region EFF.

Each of the trenches TR1, TR2, and TR3 may include a taper portion TP. The taper portion TP continuously joins an edge of the extended portion WP of the effective region EFF side. In regard to the taper portion TP, the width of each of the trenches TR1, TR2, and TR3 becomes narrower toward the effective region EFF side from the peripheral region PER side.

The configuration achieved by the above trenches TR1 to TR5 may be periodically arranged along the second direction.

The gate insulating film GO is arranged over the first surface FS. More specifically, the gate insulating film GO is arranged over the sidewalls and bottom walls of the trenches TR1 to TR5. The gate insulating film GO is formed of, for example, silicon dioxide ($SiO_2$).

The gate electrodes GE are so arranged over the gate insulating film GO as to be buried in the trenches TR1 to TR5. In the effective region EFF, the gate electrode GE includes a portion so arranged as to oppose the body region BR exposed from a sidewall of each of the trenches TR1 to TR3. That is, the gate electrode GE includes a portion opposed to the body region BR sandwiched between the source region SR and the drift region DRI while being insulated by the gate insulating film GO. The gate electrode GE is formed of, for example, polycrystalline Si where impurities are doped.

The interlayer insulating film ILD is arranged over the first surface FS. Contact holes CH1, CH2, CH3, and CH6 are provided in the interlayer insulating film ILD. Although not shown, contact holes CH4 and CH5 are provided in the interlayer insulating film ILD. The interlayer insulating film ILD is formed of, for example, $SiO_2$.

The contact holes CH1 to CH6 penetrate the interlayer insulating film ILD. The contact holes CH1 to CH5 are located in the peripheral region PER when seen in a plan view. The contact hole CH6 is located in the effective region EFF when seen in a plan view.

From the contact hole CH1, the gate electrode GE buried in the trench TR1 is exposed. From the contact hole CH2, the gate electrode GE buried in the trench TR2 is exposed. From the contact hole CH3, the gate electrode GE buried in the trench TR3 is exposed. From the contact hole CH4, the gate electrode GE buried in the trench TR4 is exposed. From the contact hole CH5, the gate electrode GE buried in the trench TR5 is exposed. From the contact hole CH6, the source region SR is exposed.

When seen in a plan view, the contact holes CH1, CH2, and CH3 are formed such that their longer sides extend along the first direction. When seen in a plan view, the contact holes CH4 and CH5 are formed such that their longer sides extend along the second direction.

Contact plugs CP1 to CP6 are arranged in the interlayer insulating film ILD. More specifically, the contact plugs CP1 to CP6 are buried in the contact holes CH1 to CH6, respectively.

The contact plugs CP1 to CP5 are electrically coupled to the gate electrodes GE. The contact plug CP6 is electrically coupled to the source region SR. The contact plugs CP1 to CP6 are formed of tungsten (W), for example.

When seen in a plan view, the contact plugs CP1, CP2, and CP3 are arranged such that their longer sides extend along the first direction. When seen in a plan view, the contact plugs CP4 and CP5 are arranged such that their longer sides extend along the second direction.

A wiring WL1 is arranged over the interlayer insulating film ILD. The wiring WL1 is located in the effective region EFF when seen in a plan view. The wiring WL1 is electrically coupled to the contact plug CP6. That is, the wiring WL1 is a source wiring electrically coupled to the source region SR through the contact plug CP6.

A wiring WL2 is arranged over the interlayer insulating film ILD. The wiring WL2 has a first portion located over the peripheral region PER when seen in a plan view. The wiring WL2 has a second portion located in the effective region when seen in a plan view. The wiring WL2 is electrically coupled to the contact plugs CP1 to CP5 at the first portion. That is, the wiring WL2 is a gate wiring coupled to the gate electrode GE through contact plugs CP1 to CP5.

The wiring WL1 and the wiring WL2 are formed of, for example, aluminum (Al), Al alloy, etc.

The passivation film PV is arranged over the interlayer insulating film ILD so as to cover the wiring WL1 and the wiring WL2. An opening OP1 and an opening OP2 are formed in the passivation film PV. The opening OP1 and the opening OP2 penetrate the passivation film PV.

From the opening OP1, apart of the wiring WL1 is exposed. From the opening OP2, a second portion of the wiring WL2 is exposed. The wiring WL1 exposed from the opening OP1 forms a source pad SP and the wiring WL2 exposed from the opening OP2 forms a gate pad GP. The passivation film PV is formed of, for example, silicon nitride (SiN), silicon oxy-nitride (SiON), etc.

Figure 5:
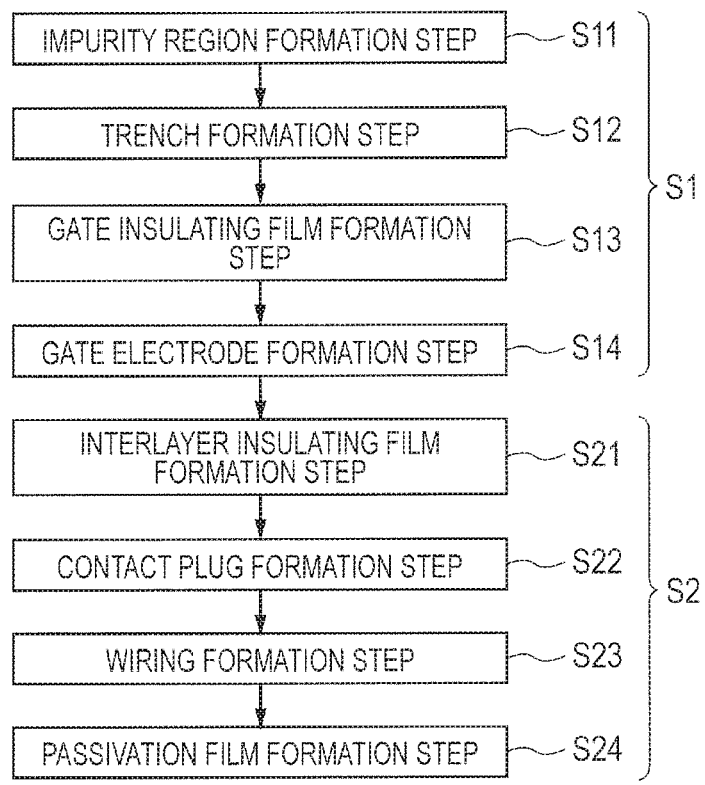
FIG. 5 is a flow chart showing a method of manufacturing the semiconductor device according to Embodiment 1.

Now, a method of manufacturing the semiconductor device according to Embodiment 1 will be described. As shown in FIG. 5, the method of manufacturing the semiconductor device according to Embodiment 1 includes a front end step S1 and a back end step S2.

The front end step S1 includes: an impurity region formation step S11; a trench formation step S12; a gate insulating film formation step S13; and a gate electrode formation step S14. The back end step S2 includes: an interlayer insulating film formation step S21; a contact plug formation step S22; a wiring formation step S23; and a passivation film formation step S24.

Figure 6A:
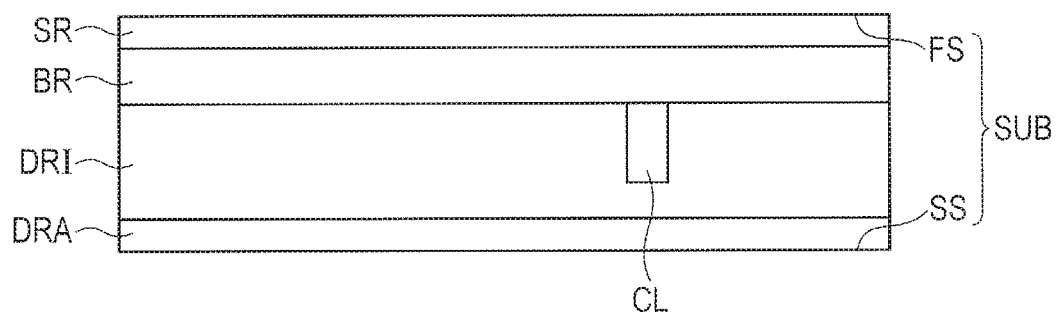
FIG. 6A is a sectional view in an effective region in an impurity region formation step of the semiconductor device according to Embodiment 1.
Figure 6B:
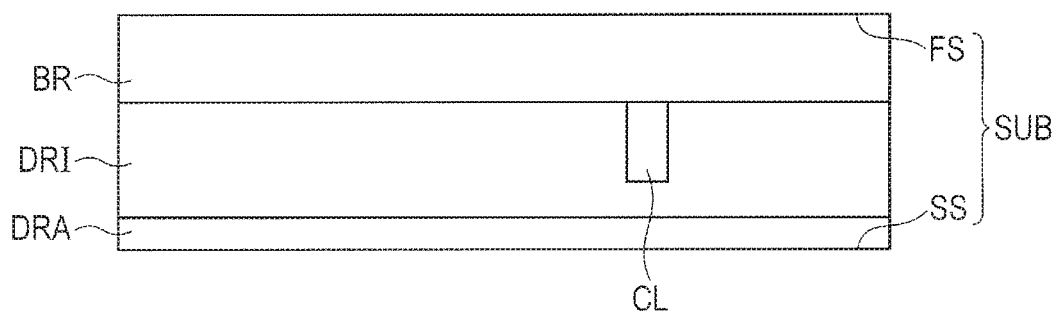
FIG. 6B is a sectional view in a peripheral region in the impurity region formation step of the semiconductor device according to Embodiment 1.

As shown in FIGS. 6A and 6B, in the impurity region formation step S11, there are formed the source region SR, the drain region DRA, the drift region DRI, and the body region BR over the semiconductor substrate SUB. Also, as shown in FIG. 6B, the source region SR is not formed in the peripheral region PER.

In the impurity region formation step S11, first, the drift region DRI is epitaxially grown over the drain region DRA. Secondly, the body region BR, the column regions CL, and the source region SR are formed by ion implantation.

Figure 7A:
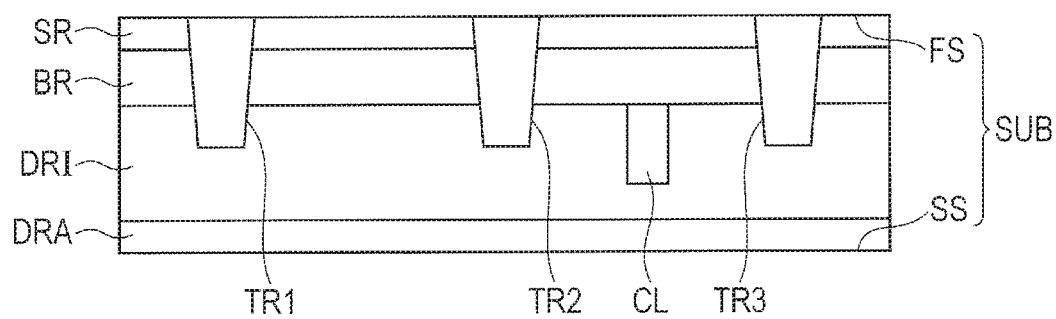
FIG. 7A is a sectional view in the effective region in a trench formation step of the semiconductor device according to Embodiment 1.
Figure 7B:
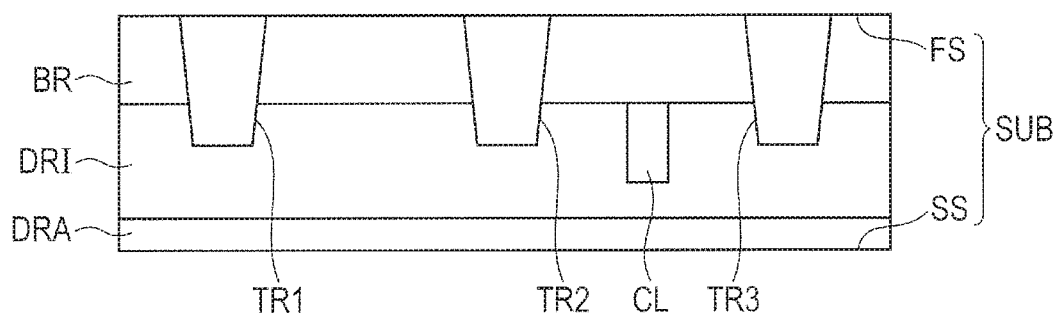
FIG. 7B is a sectional view in the peripheral region in the trench formation step of the semiconductor device according to Embodiment 1.

In the trench formation step S12, as shown in FIGS. 7A and 7B, the trenches TR1 to TR5 are formed. The trenches TR1 to TR5 are formed, for example, by applying anisotropic etching to the first surface FS using RIE (Reactive Ion Etching) etc.

Figure 8A:
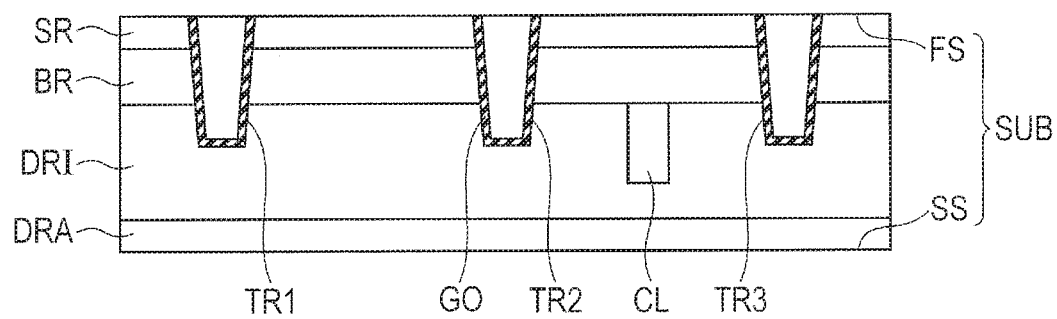
FIG. 8A is a sectional view in the effective region in a gate insulating film formation step of the semiconductor device according to Embodiment 1.
Figure 8B:
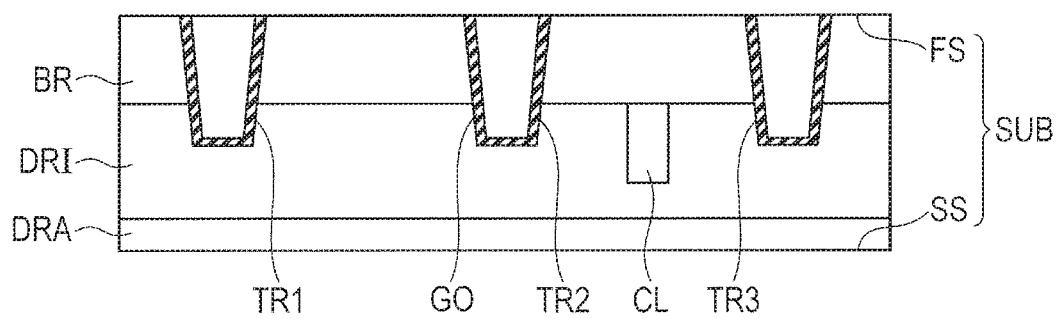
FIG. 8B is a sectional view in the peripheral region in the gate insulating film formation step of the semiconductor device according to Embodiment 1.

In the gate insulating film formation step S13, as shown in FIGS. 8A and 8B, the gate insulating film GO is formed. The gate insulating film GO is formed by thermally oxidizing sidewalls and bottom walls of the trenches TR1 to TR5, for example, by thermal oxidation.

Figure 9A:
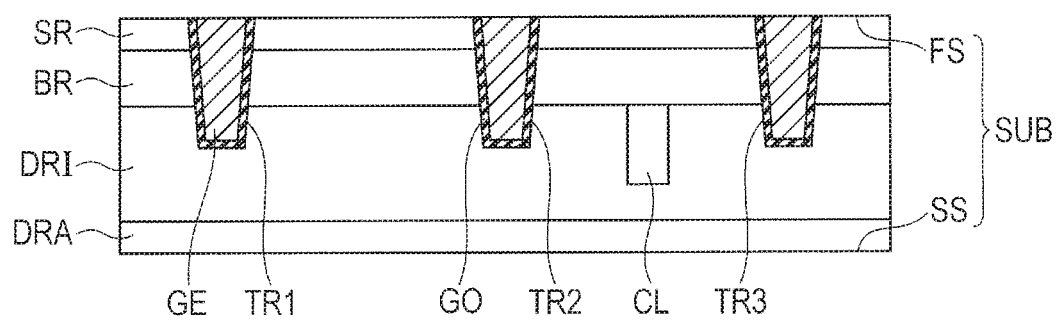
FIG. 9A is a sectional view in the effective region in a gate electrode formation step of the semiconductor device according to Embodiment 1.
Figure 9B:
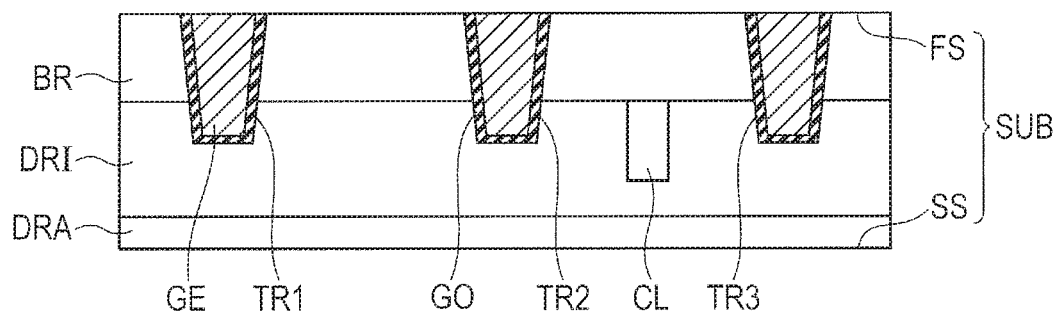
FIG. 9B is a sectional view in the peripheral region in the gate electrode formation step of the semiconductor device according to Embodiment 1.

In the gate electrode formation step S14, as shown in FIGS. 9A and 9B, the gate electrode GE is formed. In the gate electrode formation step S14, firstly, a material for forming the gate electrode GE is buried in each of the trenches TR1 to TR5 by CVD (Chemical Vapor Deposition) etc. Secondly, the material for forming the gate electrode GE flowed out of each of the trenches TR1 to TR5 is removed by etch-back, CMP (Chemical Mechanical Polishing), etc.

Figure 10A:
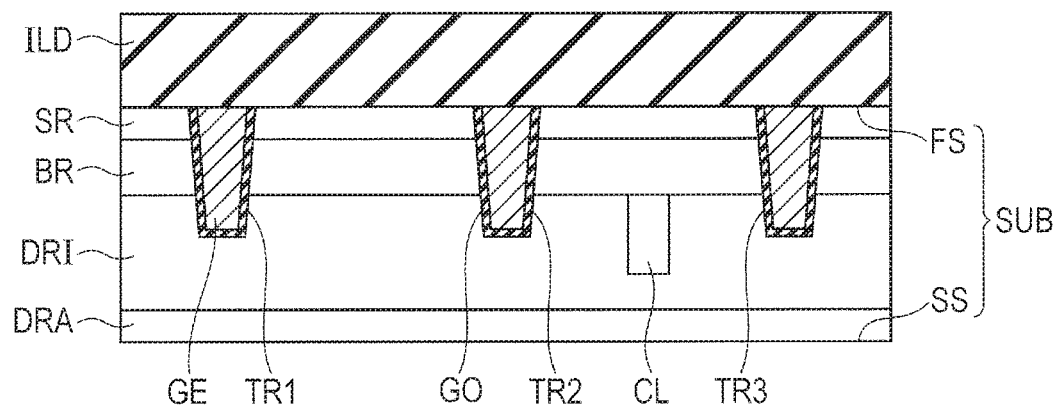
FIG. 10A is a sectional view in the effective region in an interlayer insulating film formation step of the semiconductor device according to Embodiment 1.
Figure 10B:
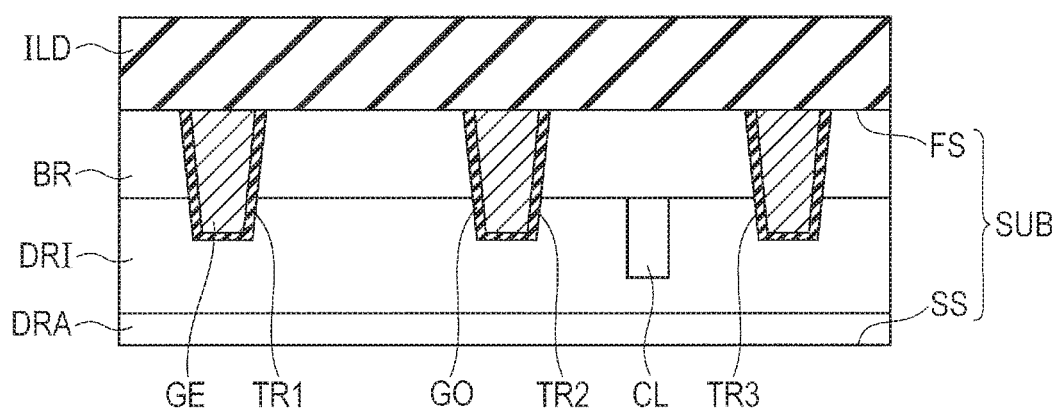
FIG. 10B is a sectional view in the peripheral region in the interlayer insulating film formation step of the semiconductor device according to Embodiment 1.

In the interlayer insulating film formation step S21, as shown in FIGS. 10A and 10B, the interlayer insulating film ILD is formed. The interlayer insulating film ILD is formed by performing film deposition of a material for forming the interlayer insulating film ILD by CVD etc. and flattening the processed material for forming the interlayer insulating film ILD by CMP etc.

Figure 11A:
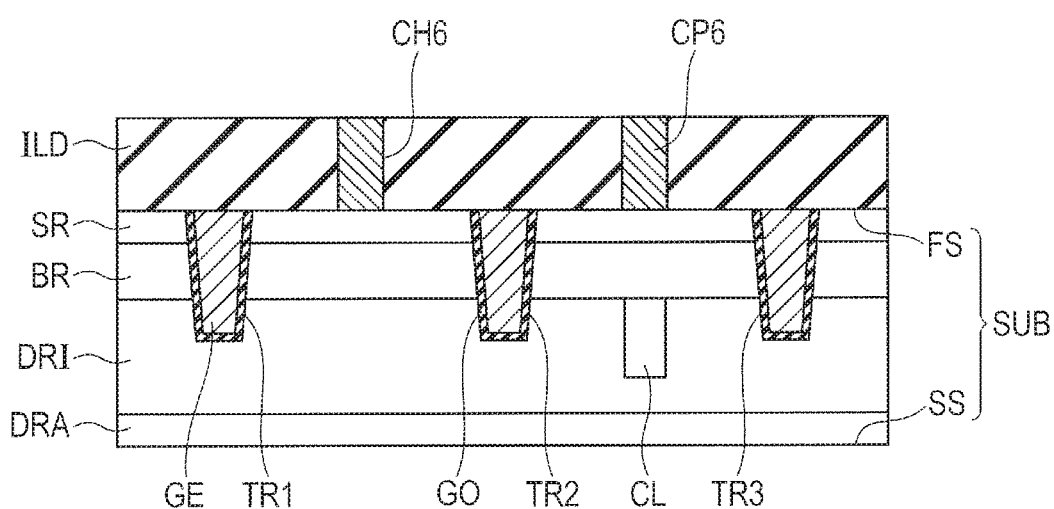
FIG. 11A is a sectional view in the effective region in a contact plug formation step of the semiconductor device according to Embodiment 1.
Figure 11B:
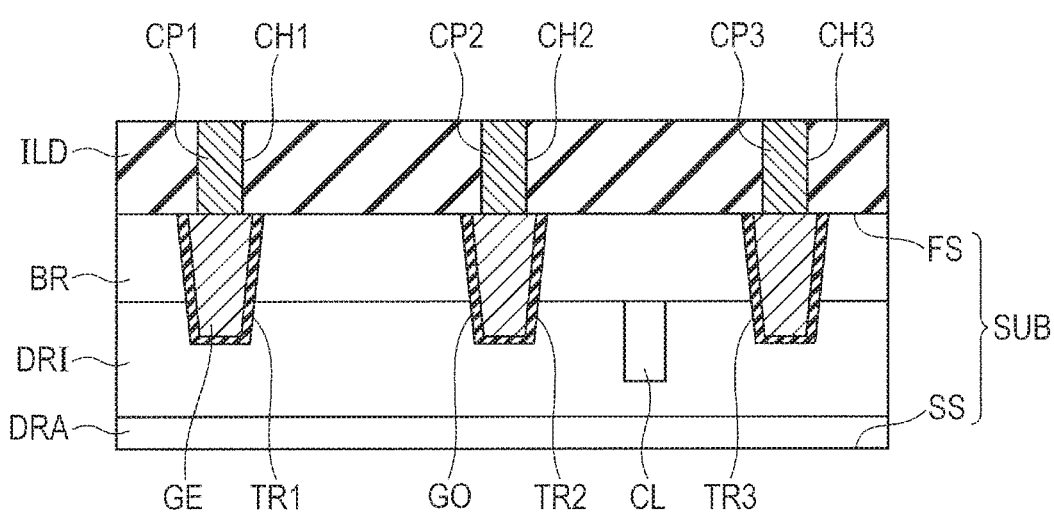
FIG. 11B is a sectional view in the peripheral region in the contact plug formation step of the semiconductor device according to Embodiment 1.

In the contact plug formation step S22, as shown in FIGS. 11A and 11B, the contact plugs CP1 to CP5 and the contact plug CP6 are formed.

In the contact plug formation step S22, first, the contact holes CH1 to CH6 are formed. The contact holes CH1 to CH6 are formed, for example, by performing anisotropic etching such as RIE.

In the contact plug formation step S22, secondly, a material for forming the contact plugs CP1 to CP6 is buried in each of the contact holes CH1 to CH6 by CVD etc.

In the contact plug formation step S22, thirdly, the material for forming contact plugs CP1 to CP6 flowed out of each of the contact holes CH1 to CH6 is removed by etch-back, CMP, etc.

Figure 12A:
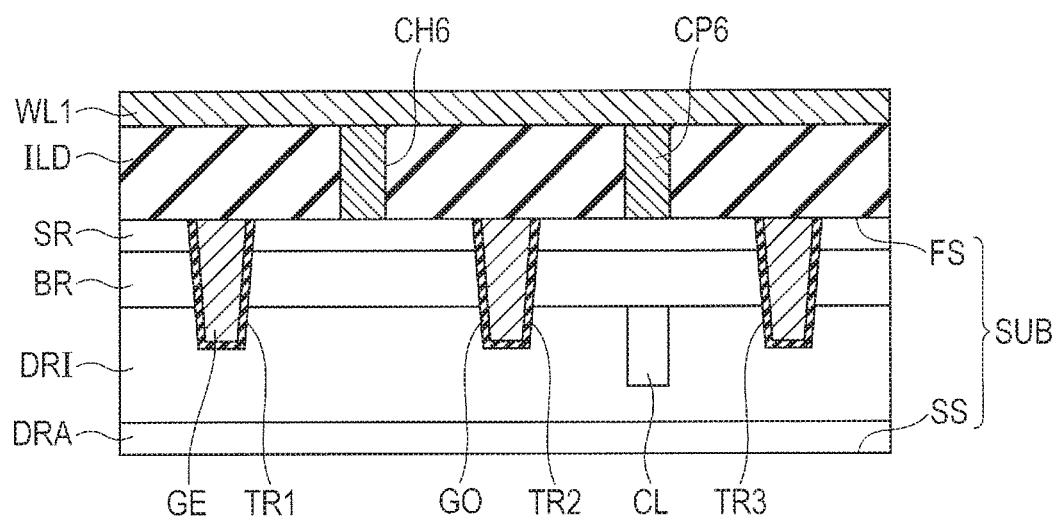
FIG. 12A is a sectional view in the effective region in a wiring formation step of the semiconductor device according Embodiment 1.
Figure 12B:
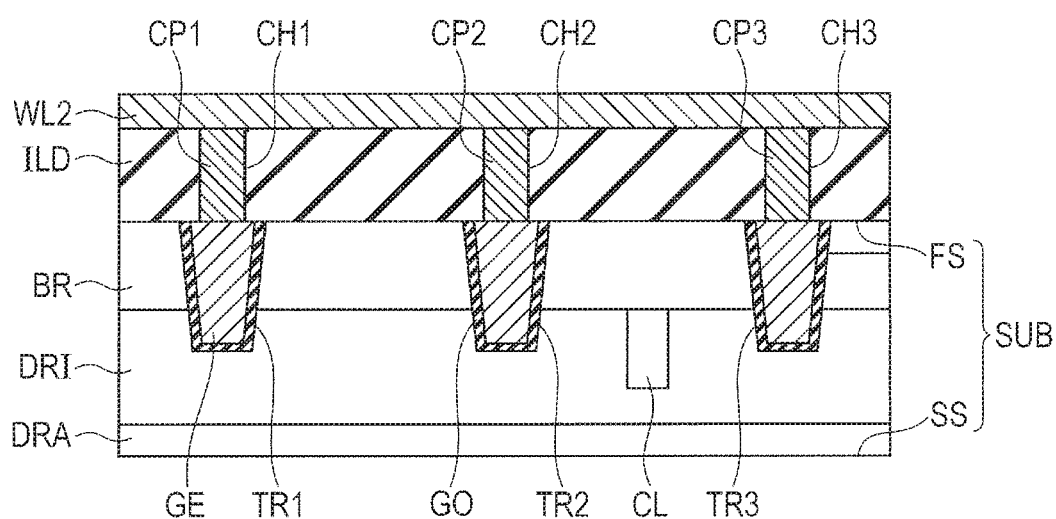
FIG. 12B is a sectional view in the peripheral region in the wiring formation step of the semiconductor device according to Embodiment 1.

In the wiring formation step S23, as shown in FIGS. 12A and 12B, the wiring WL1 and the wiring WL2 are formed. The wirings WL1 and WL2 are formed by performing film deposition of a material for forming the wirings WL1 and WL2 by sputtering etc. and, then, patterning the processed material by photolithography and etching.

In the passivation film formation step S24, the passivation film PV is formed. The passivation film PV is formed by performing film deposition of a material for forming the passivation film by CVD etc. and, then, opening the material for forming the passivation film PV after deposition of openings OP1 and OP2 by photolithography and etching.

Figure 13:
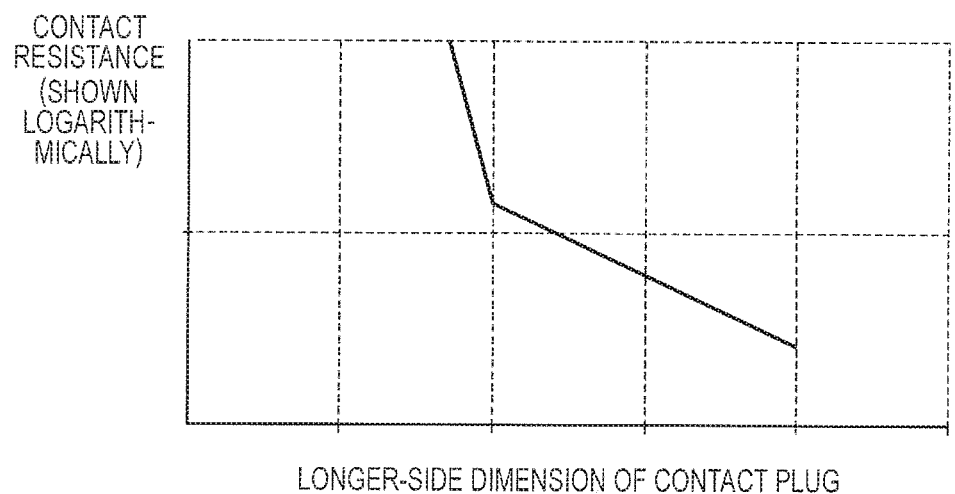
FIG. 13 is a graph which shows the relationship between a longer-side dimension of a contact plug and contact resistance.

Hereinafter, advantages of the semiconductor device according to Embodiment 1 will be explained. As shown in FIG. 13, contact resistance between the contact plug and the gate electrode increases greatly as a longer-side dimension of the contact plug decreases. A first factor for causing the above is that corner portions of the contact hole when seen in a plan view become round. A second factor for causing the above is that the longer-side dimension of the contact plug gets smaller and therefore the contact plug tends to be buried in the contact hole imperfectly.

For example, when the column regions CL are provided in a staggered manner when seen in a plan view in the semiconductor substrate SUB, the trench in which the gate electrode GE is buried must be so arranged as to avoid the column regions CL. Thus, when there is a region where a trench in which the gate electrode GE is buried cannot be provided in the semiconductor substrate SUB, it is not possible to form the trench which extends long linearly along the second direction.

Consequently, when forming the contact plug such that its longer side is along the second direction, the longer-side dimension of the contact plug becomes short, causing the contact resistance to increase. This becomes more prominent when a cell pitch (an interval between the trench TR1 and the trench TR2, an interval between the trench TR1 and the trench TR3) of the trench-gate type power MOSFET becomes smaller.

As described above, in the semiconductor device according to Embodiment 1, the contact plug CP1 (CP2, CP3) is electrically coupled to the gate electrode GE buried in the trench TR1 (TR2, TR3) in the peripheral region PER such that its longer side is along the first direction. Therefore, according to the semiconductor device of Embodiment 1, even when the trench in which the gate electrode GE is buried cannot be provided long linearly along the second direction, regardless of the size of the cell pitch, the longer-side dimension of the contact plug can be secured. That is, according to the semiconductor device of Embodiment 1, even when the trench in which the gate electrode GE is buried cannot be provided long linearly along the second direction, increase in the contact resistance can be suppressed.

In addition, according to the semiconductor device of Embodiment 1, in order to secure the dimension of the longer side of the contact plug, a width of the peripheral region PER becomes comparatively large. However, a ratio of the width of the peripheral region PER in a whole width of the chip is very small. Therefore, in the semiconductor device according to Embodiment 1, a chip area does not increase greatly.

In the semiconductor device according to Embodiment 1, when the trench TR1 (TR2, TR3) has the extended width portion WP in the peripheral region PER, it becomes possible to suppress displaced formation of the contact plug CP1 (CP2, CP3) from the gate electrode GE accompanying displacement of a mask.

In the semiconductor device according to Embodiment 1, when the trench TR1 (TR2, TR3) has the taper portion TP, occurrence of electric field concentration accompanying the width of the trench TR1 (TR2, TR3) changing rapidly can be suppressed.

In the semiconductor device according to Embodiment 1, when the trenches TR4 and TR5 are provided and the gate electrodes GE buried in the trenches TR4 and TR5 are electrically coupled with the contact plugs CP4 and CP5, the contact area of the contact plugs and the gate electrodes GE can be further increased. Therefore, in this case, increase in the contact resistance can be further suppressed.

Embodiment 2

Now, a configuration of a semiconductor device according to Embodiment 2 will be described. Also, hereinafter, the points different from the configuration of the semiconductor device according to Embodiment 1 will mainly be explained and overlapping explanations will be omitted.

The semiconductor device according to Embodiment 2 includes a semiconductor substrate SUB, a gate insulating film GO, and a gate electrode GE. The semiconductor device according to Embodiment 2 includes an interlayer insulating film ILD, a wiring WL1, a wiring WL2, a contact plug CP6, and a passivation film PV. With respect to these points, the configuration of the semiconductor device according to Embodiment 2 is in common with that of the semiconductor device according to Embodiment 1.

Figure 14:
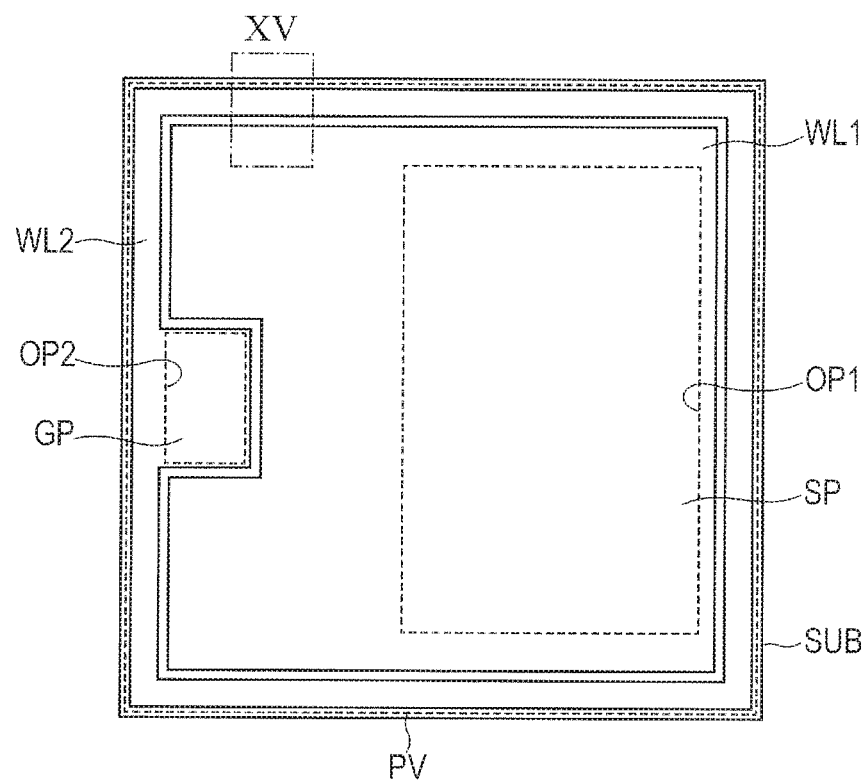
FIG. 14 is a top view of a semiconductor device according to Embodiment 2.
Figure 15:
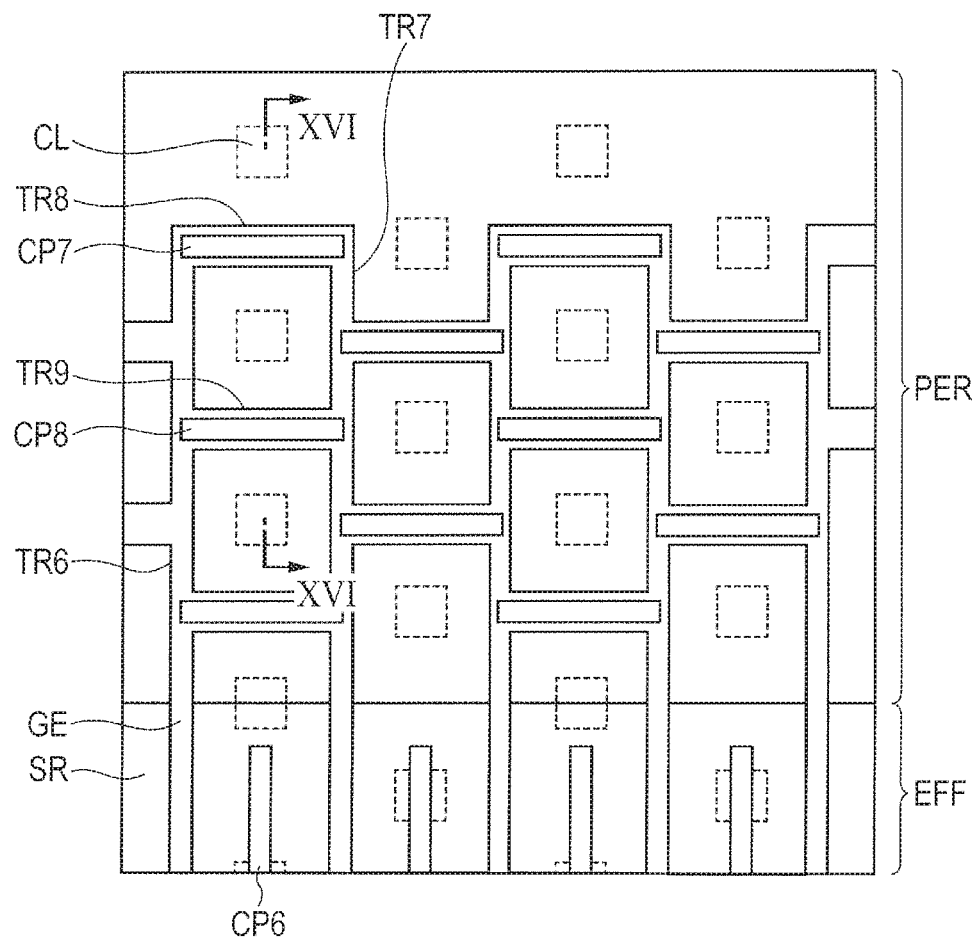
FIG. 15 is an enlarged view in a region XV-XV of FIG. 14.
Figure 16:
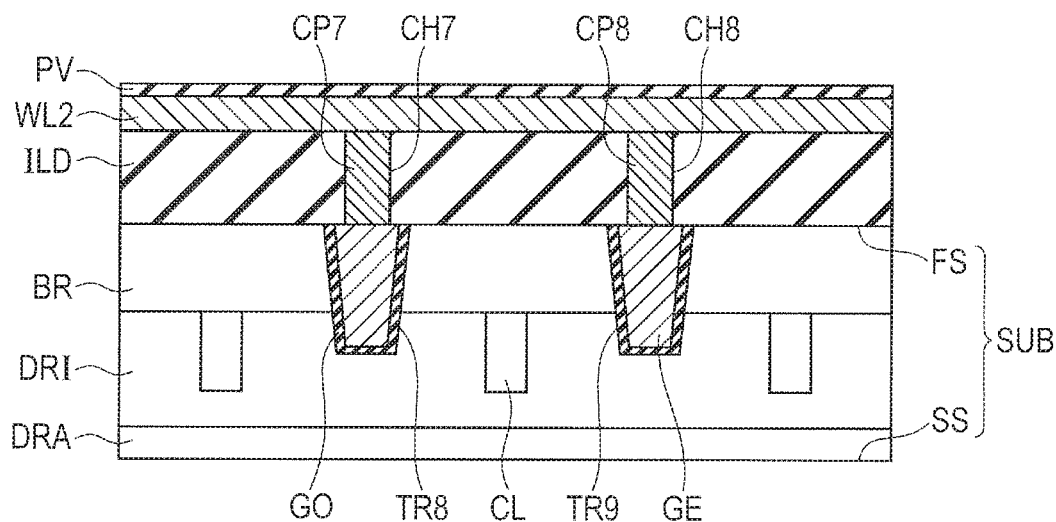
FIG. 16 is a sectional view taken along line XVI-XVI of FIG. 15.

As shown in FIGS. 14 to 16, in the semiconductor device according to Embodiment 2, trenches TR6, TR7, TR8, and TR9 are provided in the first surface FS. The semiconductor device according to Embodiment 2 includes a contact plug CP7 and a contact plug CP8. With respect to these points, the configuration of the semiconductor device according to Embodiment 2 is different from the configuration of the semiconductor device according to Embodiment 1.

The trenches TR6 to TR9 extend toward the second surface SS. The trenches TR6 to TR9 extend so as to reach the drift region DRI. In the effective region EFF, the source region SR, the body region BR, and the drift region DRI are exposed from sidewalls of the trench TR6 and the trench TR7.

The trenches TR6 and TR7 extend from the peripheral region PER over the effective region EFF along the first direction. The trench TR8 and the trench TR9 extend along the second direction in the peripheral region PER.

In the second direction, the trench TR6 is arranged adjacent to the trench TR7, while being spaced from the trench TR7. The trench TR8 couples the trench TR6 with the trench TR7. More specifically, the trench TR8 couples an edge of the trench TR6 on the peripheral region PER side with an edge of the trench TR7 on the peripheral region PER side. The trench TR9 couples the trench TR6 with the trench TR7. The trench TR9 is located closer to the effective region EFF than the trench TR8 in the first direction.

When seen in a plan view, the trenches TR6 to TR9 are so arranged as not to overlap with the column regions CL. To put it differently, the trenches TR6 to TR9 are so arranged, when seen in a plan view, as to pass through the column regions CL.

Widths in the first direction of the trenches TR8 and TR9 may be larger than widths in the second direction of the trenches TR6 and TR7.

The trenches TR6 and TR7 may be periodically arranged along the second direction. The trenches TR8 and TR9 may be periodically arranged along the first direction.

The gate insulating film GO is arranged over the sidewalls and bottom walls of the trenches TR6, TR7, TR8, and TR9. The gate electrodes GE are so arranged over the gate insulating film GO as to be buried in the trenches TR6 to TR9.

A contact hole CH7 and a contact hole CH8 are provided in the interlayer insulating film ILD. The contact hole CH7 and the contact hole CH8 are arranged in the peripheral region PER. From the contact hole CH7, the gate electrode GE buried in the trench TR8 is exposed. From the contact hole CH8, the gate electrode GE buried in the trench TR9 is exposed.

The contact plug CP7 and the contact plug CP8 are arranged in the interlayer insulating film ILD. More specifically, the contact plugs CP7 and CP8 are buried in the contact holes CH7 and CH8, respectively. The contact plug CP7 and the contact plug CP8 are electrically coupled to the gate electrode GE and the wiring WL2. When seen in a plan view, the contact plugs CP7 and CP8 are arranged such that their longer sides extent along the second direction.

Now, a method of manufacturing the semiconductor device according to Embodiment 2 will be described. Also, hereinafter, the points different from those of the semiconductor device according to Embodiment 1 will mainly be explained and overlapping explanations will be omitted.

The manufacturing method of the semiconductor device according to Embodiment 2 includes a front end step S1 and a back end step S2. The front end step S1 includes an impurity region formation step S11, a trench formation step S12, a gate insulating film formation step S13, and a gate electrode formation step S14. The back end step S2 includes an interlayer insulating film formation step S21, a contact plug formation step S22, a wiring formation step S23, and a passivation film formation step S24. With respect to these points, the manufacturing method of the semiconductor device according to Embodiment 2 is in common with that of the semiconductor device according to Embodiment 1.

However, the manufacturing method of the semiconductor device according to Embodiment 2 is different from that of the semiconductor device according to Embodiment 1 in that the trenches TR6 to TR9 are formed in place of the trenches TR1 to TR5 in the trench formation step S12. Further, the manufacturing method of the semiconductor device according to the second embodiment is also different from that of the semiconductor device according to Embodiment 1 in that the contact holes CH7 and CH8 are formed in place of the contact holes CH1 to CH5 in the contact plug formation step S22.

In addition, the manufacturing method of the semiconductor device according to Embodiment 2 is different from that of the semiconductor device according to Embodiment 1 in that the contact plugs CP7 and CP8 are formed in place of the contact plugs CP1 to CP5 in the contact plug formation step S22.

Hereinafter, advantages of the semiconductor device according to Embodiment 2 will be explained. As described above, according to the semiconductor device of Embodiment 2, the contact plugs CP7 and CP8 are electrically coupled to the gate electrodes GE buried in the trenches TR8 and TR9 in the peripheral region PER. As a consequence, according to the semiconductor device of Embodiment 2, even when the trench in which the gate electrode GE is buried cannot be provided long linearly along the second direction, by providing the plural contact plugs along the first direction, it becomes possible to secure a contact area of the contact plug and the gate electrode GE.

That is, according to the semiconductor device of Embodiment 2, even when the trench in which the gate electrode GE is buried cannot be provided long linearly along the second direction, it becomes possible to suppress increase in the contact resistance.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:
1. A semiconductor device, comprising:
   a semiconductor substrate which includes a first surface and a second surface opposite to the first surface and over which there are formed a source region of a first conductivity type arranged in the first surface, a drain region of the first conductivity type arranged in the second surface, a drift region of the first conductivity type arranged in the drain region of the first source side, and a body region of a second conductivity type being opposite to the first conductivity type sandwiched between the source region and the drift region;
   a gate electrode; and
   a first contact plug,
   wherein, in the first surface, a first trench is provided which extends toward the second surface so as to reach the drift region and in which the gate electrode is buried,
   wherein the first surface includes an effective region in which the source region is arranged and a peripheral region which surrounds the effective region,
   wherein the first trench extends from the peripheral region over the effective region, when seen in a plan view, along a first direction from the peripheral region toward the effective region,
   wherein the gate electrode includes a portion opposed to and insulated from the body region sandwiched between the source region and the drift region,
   wherein the first contact plug is electrically coupled to the gate electrode buried in the first trench in the peripheral region such that its longer side is along the first direction when seen in a plan view, wherein the first trench in the peripheral region includes an extended width portion, and
wherein a width of the extended width portion in a second direction perpendicular to the first direction is greater than a width of the first trench in the effective region in the second direction.

2. The semiconductor device according to claim 1,
wherein the first trench in the peripheral region includes a taper portion continuously joining an edge of the extended width portion on the effective region side, and
wherein a width of the taper portion in the second direction becomes smaller from the peripheral region side toward the effective region side.

3. A semiconductor device, comprising:
a semiconductor substrate which includes a first surface and a second surface opposite to the first surface and over which there are formed a source region of a first conductivity type arranged in the first surface, a drain region of the first conductivity type arranged in the second surface, a drift region of the first conductivity type arranged in the drain region of the first source side, and a body region of a second conductivity type being opposite to the first conductivity type sandwiched between the source region and the drift region;
a gate electrode;
a first contact plug,
wherein, in the first surface, a first trench is provided which extends toward the second surface so as to reach the drift region and in which the gate electrode is buried,
wherein the first surface includes an effective region in which the source region is arranged and a peripheral region which surrounds the effective region,
wherein the first trench extends from the peripheral region over the effective region, when seen in a plan view, along a first direction from the peripheral region toward the effective region,
wherein the gate electrode includes a portion opposed to and insulated from the body region sandwiched between the source region and the drift region, and
wherein the first contact plug is electrically coupled to the gate electrode buried in the first trench in the peripheral region such that its longer side is along the first direction when seen in a plan view;
wherein the first trench in the peripheral region includes an extended width portion, and
wherein a width of the extended width portion in a second direction perpendicular to the first direction is greater than a width of the first trench in the effective region in the second direction;
a second contact plug; and
a third contact plug,
wherein, in the first surface, a second trench, a third trench, a fourth trench, and a fifth trench are provided which extend toward the second surface so as to reach the drift region and in each of which the gate electrode is buried,
wherein the second trench and the third trench extend from the peripheral region over the effective region along the first direction,
wherein, in the peripheral region, the fourth trench and the fifth trench extends along a second direction perpendicular to the first direction,
wherein each of the second trench and the third trench is arranged adjacent to but spaced from the first trench,
wherein the fourth trench is coupled to the first trench and the second trench in the peripheral region,
wherein the fifth trench is coupled to the first trench and the third trench in the peripheral region closer to the effective region side than the fourth trench,
wherein, in the peripheral region, the second contact plug is electrically coupled to the gate electrode buried in the second trench such that its longer side is along the first direction when seen in a plan view, and
wherein, in the peripheral region, the third contact plug is electrically coupled to the gate electrode buried in the third trench such that its longer side is along the first direction when seen in a plan view.

4. The semiconductor device according to claim 3, further comprising a plurality of column regions of the second conductivity type extending from the body region toward the second surface,
wherein, the column regions are arranged in a staggered manner, being spaced from each other when seen in a plan view, and
wherein the first trench, the second trench, the third trench, the fourth trench, and the fifth trench are so arranged as to pass through the column regions when seen in a plan view.

5. The semiconductor device according to claim 3, further comprising a fourth contact plug,
wherein the fourth contact plug is electrically coupled to the gate electrode buried in the fourth trench.

6. The semiconductor device according to claim 5, further comprising a fifth contact plug,
wherein the fifth contact plug is electrically coupled to the gate electrode buried in the fifth trench.

7. A semiconductor device, comprising:
a semiconductor substrate which includes a first surface and a second surface opposite to the first surface and over which there are formed a source region of a first conductivity type arranged in the first surface, a drain region of the first conductivity type arranged in the second surface, a drift region of the first conductivity type arranged in the drain region of the first surface side, and a body region of a second conductivity type opposite to the first conductivity type sandwiched between the source region and the drift region;
a gate electrode;
a first contact plug; and
a second contact plug,
wherein, in the first surface, a first trench, a second trench, a third trench, and a fourth trench are provided which extend toward the second surface so as to reach the drift region and in each of which the gate electrode is buried,
wherein the first surface includes an effective region in which the source region is arranged and a peripheral region which surrounds the effective region,
wherein the first trench and the second trench extend from the peripheral region over the effective region, when seen in a plan view, along a first direction from the peripheral region toward the effective region,
wherein the third trench and the fourth trench extend along a second direction perpendicular to the first direction in the peripheral region,
wherein the fourth trench is coupled to the first trench and the second trench in the peripheral region closer to the effective region side than the third trench,
wherein the first contact plug is electrically coupled to the gate electrode buried in the third trench, and
wherein the second contact plug is electrically coupled to the gate electrode buried in the fourth trench.

8. The semiconductor device according to claim 7 further comprising a plurality of column regions of the second conductivity type extending from the body region toward the second surface,
  wherein the column regions are arranged in a staggered manner, being spaced from each other when seen in a plan view, and
  wherein the first trench, the second trench, the third trench and the fourth trench are so arranged as to pass through the column regions when seen in a plan view.

* * * * *